(12) United States Patent
Chen

(10) Patent No.: US 6,639,805 B1
(45) Date of Patent: Oct. 28, 2003

(54) CASING FOR A PC CARTRIDGE

(76) Inventor: Wan-Tien Chen, 10F, No. 106-2, Sec. 2, Chungshan N. Rd., Taipei (TW)

( * ) Notice: Subject to any disclaimer, the term of this patent is extended or adjusted under 35 U.S.C. 154(b) by 0 days.

(21) Appl. No.: 10/197,500

(22) Filed: Jul. 18, 2002

(51) Int. Cl.$^7$ .................................................. H05K 1/14
(52) U.S. Cl. ...................... 361/737; 361/825; 361/730; 361/816; 439/76.1; 439/946
(58) Field of Search ................... 361/737, 730, 361/818, 816, 752, 825, 684, 685; 439/326, 946, 607, 76.1

(56) References Cited

U.S. PATENT DOCUMENTS

| | | | |
|---|---|---|---|
| 5,339,222 A | * | 8/1994 | Simmons et al. ............. 361/818 |
| 5,502,617 A | * | 3/1996 | Tsukada et al. ............. 361/686 |
| 5,547,397 A | * | 8/1996 | Hirai ........................... 439/607 |
| 6,315,205 B1 | * | 11/2001 | Bates, III .................... 235/479 |

* cited by examiner

*Primary Examiner*—David Martin
*Assistant Examiner*—Hung Bui
(74) *Attorney, Agent, or Firm*—Venable LLP; Fei-Fei Chao

(57) ABSTRACT

A casing for a PC cartridge includes an upper casing having clamping sides respectively formed on opposite sides of the upper casing, two hooks respectively and oppositely formed on a front side of the upper casing, a lower casing securely connected to the upper casing and having a plastic frame with a tilting side formed on opposite sides of the frame, a pair of front positioning blocks oppositely formed on a front side of the frame and a pair of rear positioning blocks oppositely formed on a rear side of the frame, wherein each of the front positioning blocks has an L shaped hole corresponding to the hooks of the upper casing. Each clamping side clamping a bottom of a corresponding one of the tilting sides and the hooks being received in the L shaped holes secure engagement between the upper casing and the lower casing.

1 Claim, 7 Drawing Sheets

CASING FOR A PC CARTRIDGE

BACKGROUND OF THE INVENTION

1. Field of the Invention

The present invention relates to a casing, and more particularly to a casing for a PC cartridge. The casing enables the user to have a firm grip without deforming the shape of the casing.

2. Description of Related Art

A conventional PC cartridge is somewhat like a business card and has therein a connector for connection with a connecting port on a computer. The conventional cartridge usually is composed of an upper casing, a lower casing and a frame made of plastic to surround a joint between the upper casing and the lower casing. However, because the requirements for such a PC cartridge are being light, thin, short and small, the material chosen for making the casing is mainly a light-weight, thin plate. Furthermore, the connector on the open end of the PC cartridge is short such that a large room in the PC cartridge is empty and there is nothing to support the structural integrity. Therefore, when the user is travelling with the PC cartridge, the casing of the cartridge is easily deformed and thus damaged. Despite the damage caused from travelling, when the user is trying to pull off the PC cartridge from the computer port, the holding of the casing of the cartridge so as to remove the cartridge from the computer will cause serious deformation to the casing.

When there is a deformation, opposite sides of the cartridge will easily flip over and thus the user is easily cut by accident.

To overcome the shortcomings, the present invention tends to provide an improved casing for a PC cartridge to mitigate and obviate the aforementioned problems.

SUMMARY OF THE INVENTION

The primary objective of the present invention is to provide a casing for a PC cartridge. The casing has a holding portion provided at the rear of the casing such that the user is able to hold the holding portion to dispose the cartridge as required without casing any damage to the casing.

Another objective of the present invention is to provide a holding edge formed on a front side of the holding portion. Therefore, the user is able to use the holding edge to pull the cartridge out of the computer port without deforming the casing.

Still another objective of the present invention is to provide a casing having a hook formed on a front edge of an upper casing and an L shaped hole defined in a front edge of a lower casing to correspond to the hook of the upper casing. Further, a clamping side is formed on opposite sides of the upper casing and a tilting side is formed on opposite sides of the lower casing. Therefore, when the upper casing and the lower casing are combined, the combination between the hook and the L shaped hole and the combination between the clamping side and the tilting side are able to secure the engagement between the upper casing and the lower casing.

Other objects, advantages and novel features of the invention will become more apparent from the following detailed description when taken in conjunction with the accompanying drawings.

DETAILED DESCRIPTION OF THE PREFERRED EMBODIMENT

Figure 1:
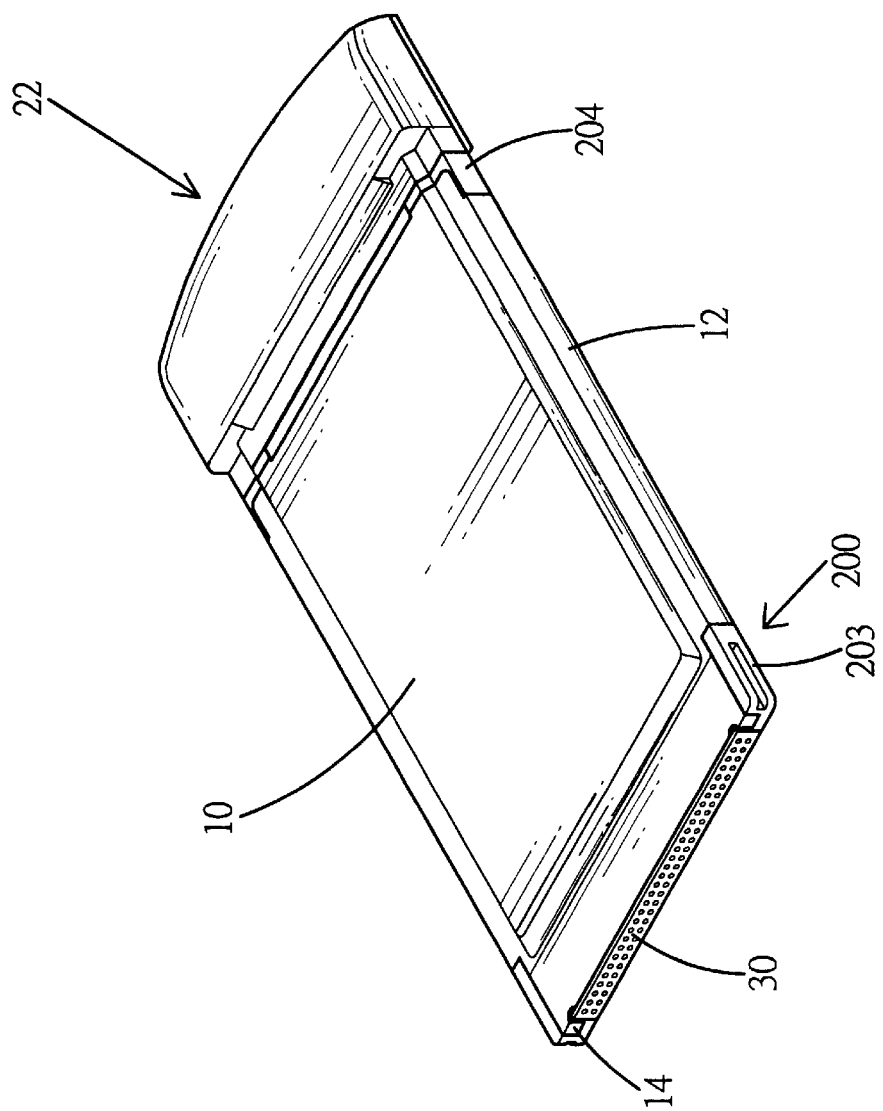
FIG. 1 is a perspective view of the PC cartridge.
Figure 2:
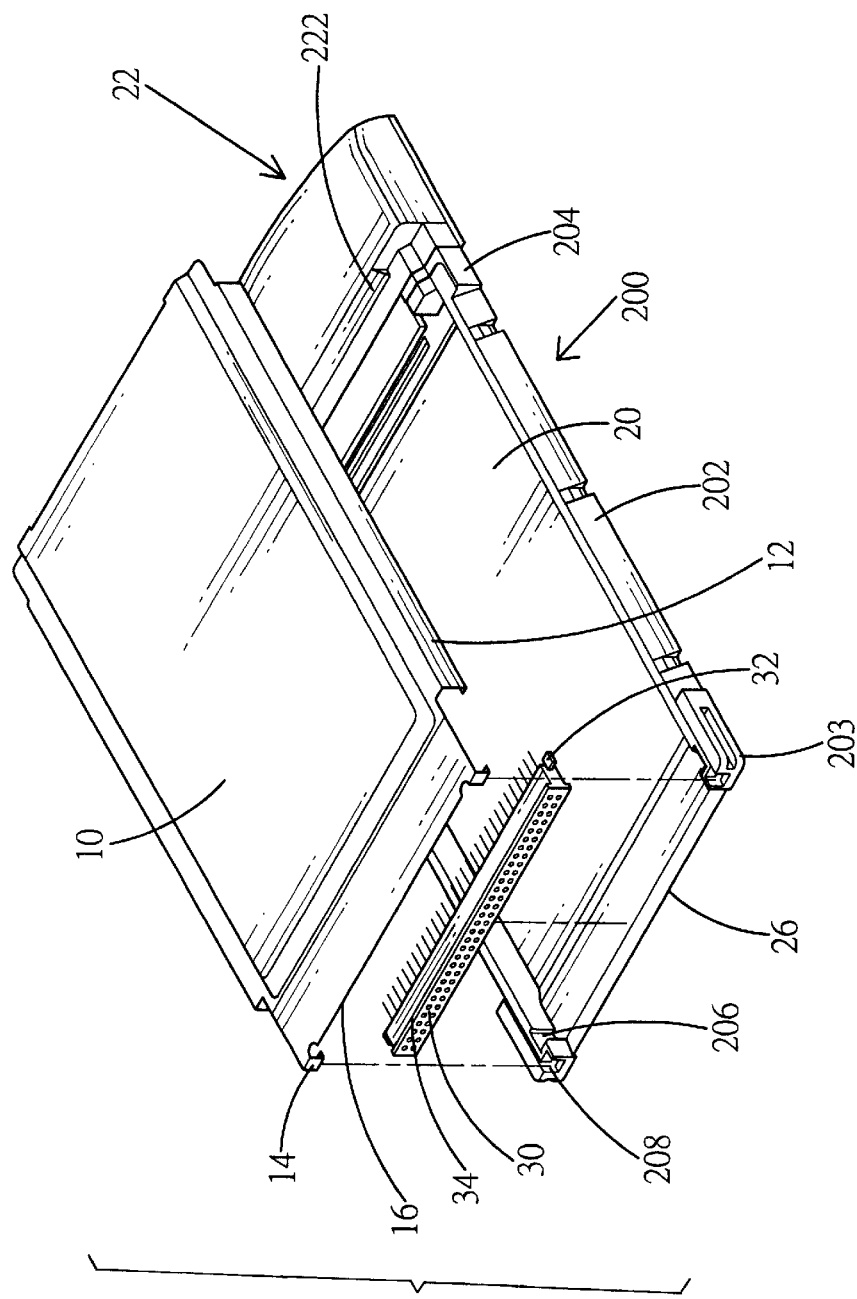
FIG. 2 is an exploded perspective view of the cartridge.

With reference to FIGS. 1 and 2, the casing for a PC cartridge is composed of an upper casing (10) and a lower casing (20), wherein a connector (30) is sandwiched between the upper casing (10) and the lower casing (20).

The upper casing (10) has clamping sides (12) respectively formed on opposite sides of the upper casing (10), two hooks (14) respectively and oppositely formed on a front side of the upper casing (10).

The lower casing (20) has a holding portion (22) formed on a rear of the lower casing (20) and a holding edge (222) formed on a front edge of the holding portion (22). The holding edge (222) is preferably inclined to a top face of the holding portion (22) in this embodiment. The lower casing (20) has a plastic frame (200) with a tilting side (202) formed on opposite sides of the frame (200), a pair of front positioning blocks (203) oppositely formed on the front side of the frame (200) and a pair of rear positioning blocks (204) oppositely formed on the rear side of the frame (200) and adjacent to the holding edge (222). Each of the front positioning blocks (203) has a cutout (206) defined to correspond to each other and an L shaped hole (208) corresponding to the hooks (14) of the upper casing (10). It is noted that the connector (30) has two protrusions (32) oppositely formed on a side of the connector (30) to correspond to the cutouts (206) of the front positioning blocks (203).

Figure 3:
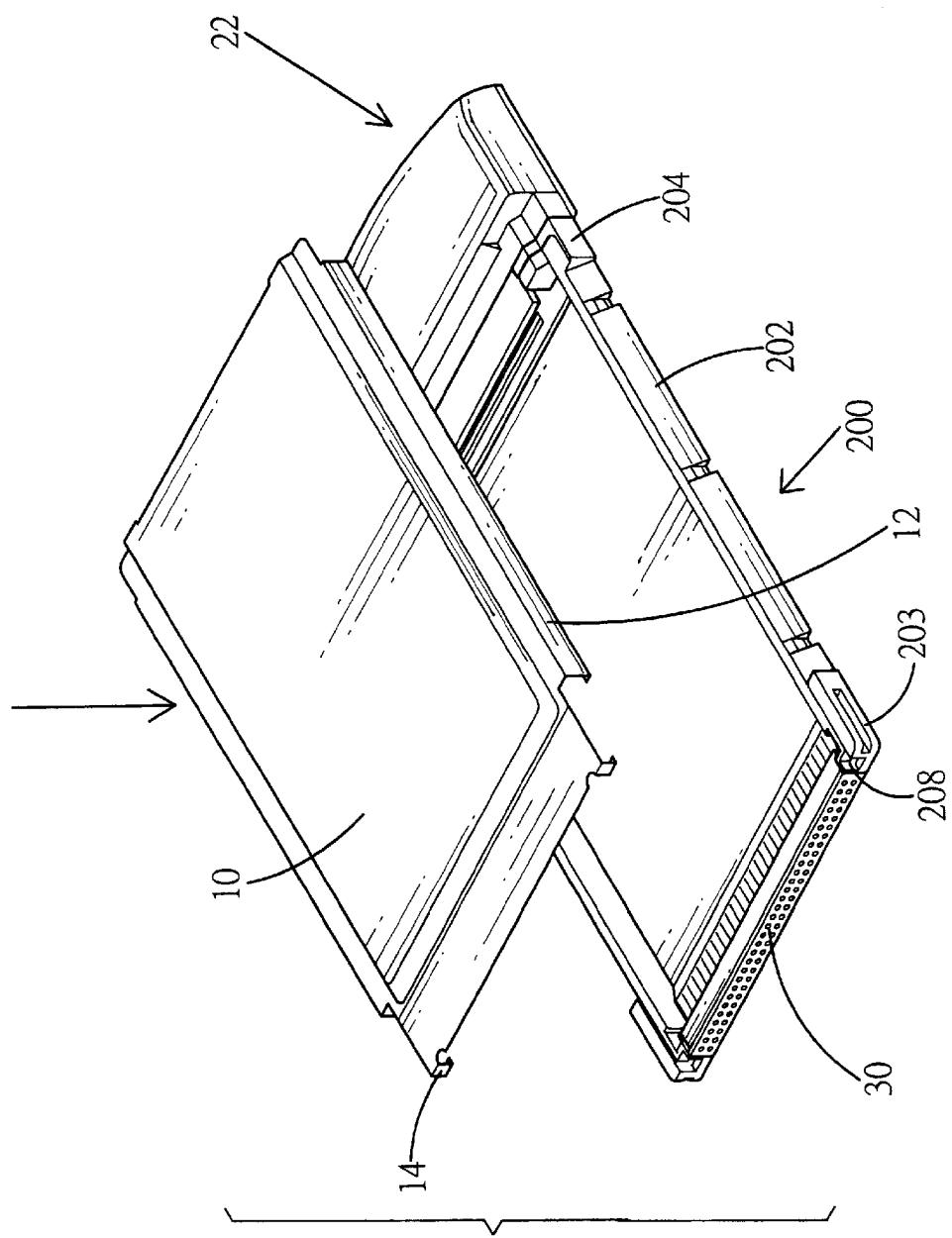
FIG. 3 is an exploded perspective view of the casing of the present invention.
Figure 4:
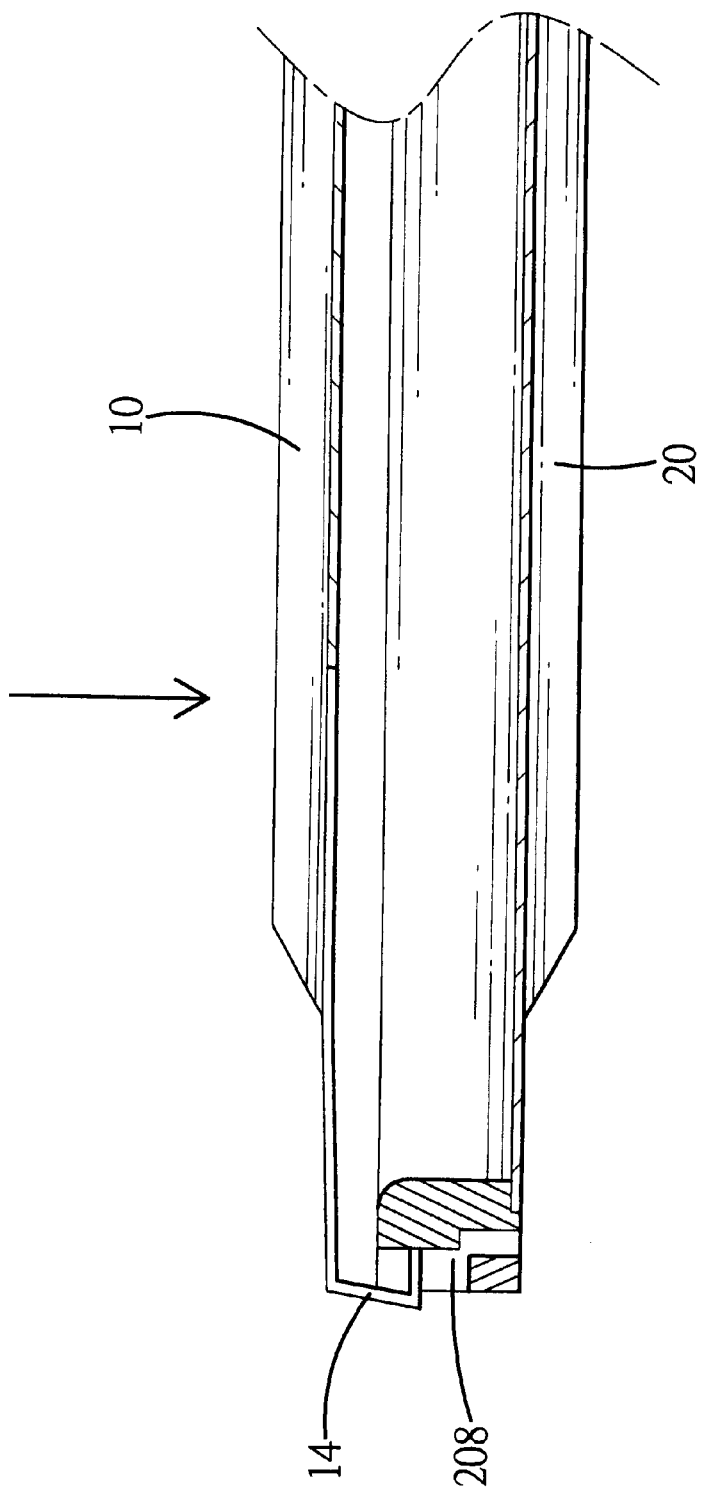
FIG. 4 is a schematic view showing that the casing of the present invention is in process of assembly.
Figure 6:
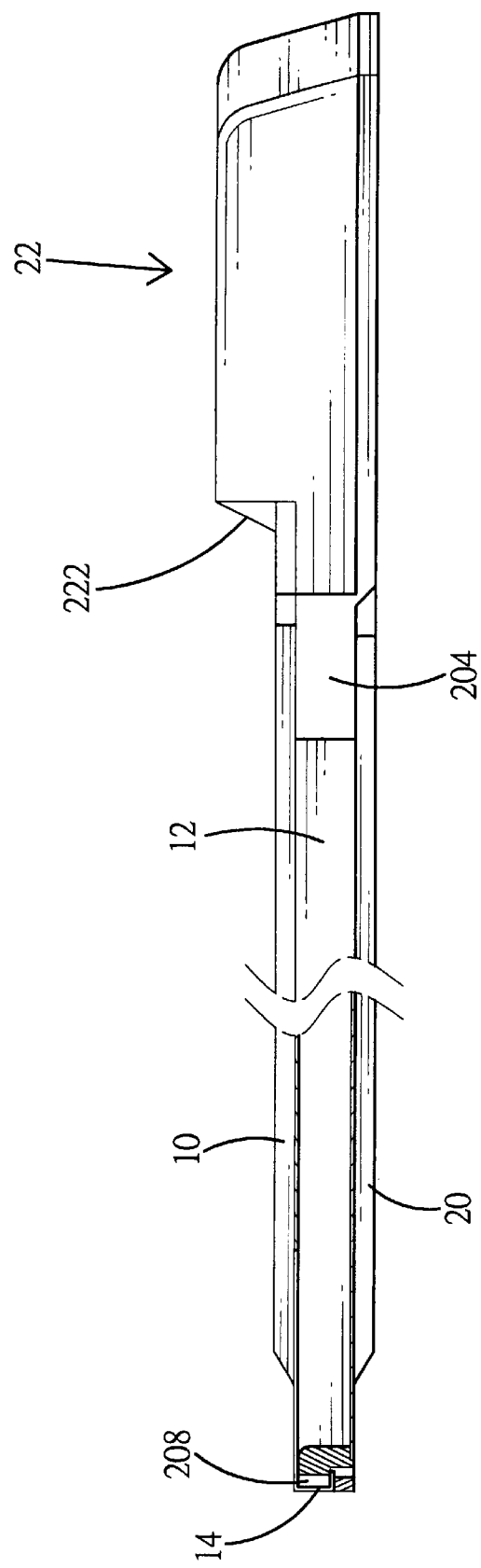
FIG. 6 is a schematic cross sectional view showing that the hook is inserted into the L shaped hole.

With reference to FIGS. 3, 4 and 6, during assembly of the casing of the present invention, the upper casing (10) is pressed downward to the lower casing (20). The clamping sides (12) of the upper casing (10) first engage with the tilting sides (202) of the lower casing (20) and are bent due to the inclined faces of the tilting sides (202). After the clamping sides (12) slide through the tilting sides (202), the clamping sides (12), due to the respective resilience from the material chosen to make the upper casing (10), securely clamp a bottom of the tilting sides (202).

Further, when the upper casing (10) is moving toward the lower casing (20), the hooks (14) extend into the L shaped holes (208) so that the engagement between the upper casing (10) and the lower casing (20) is secured.

With the structure as described, the user is able to hold the holding portion (22) to dispose the cartridge and grip the holding edge (222) to pull the cartridge out of the computer port without causing any damage to the casing.

Figure 5:
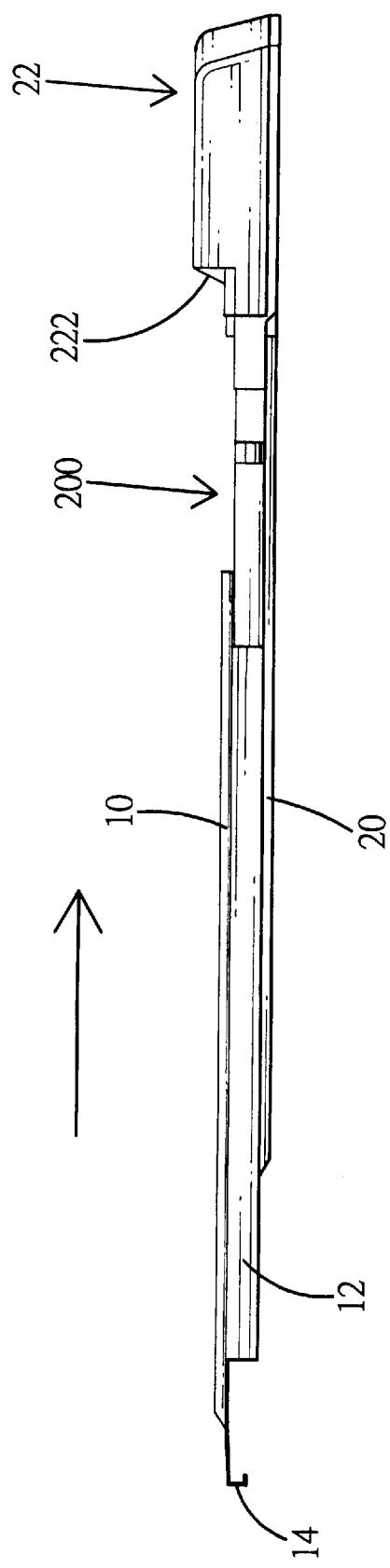
FIG. 5 is a schematic view showing that the casing of the present invention is in process of an alternative assembly manner.

With reference to FIG. 5 and referring to FIG. 6, another assembly of the casing may be adopted. When in assembly, the clamping sides (12) of the upper casing (10) are widened to clamp a bottom side of the front positioning blocks (203). Then the upper casing (10) is moved rearward to the holding portion (22) till the clamping sides (12) are located between the front positioning block (203) and the rear positioning block (204). Therefore, the clamping sides (12) of the upper casing (10) are able to clamp the bottom sides of the tilting sides (202) of the lower casing (20). Meanwhile, the hooks (14) are received in the L shaped holes (208), which completes the assembly of the casing of the present invention.

Figure 7:
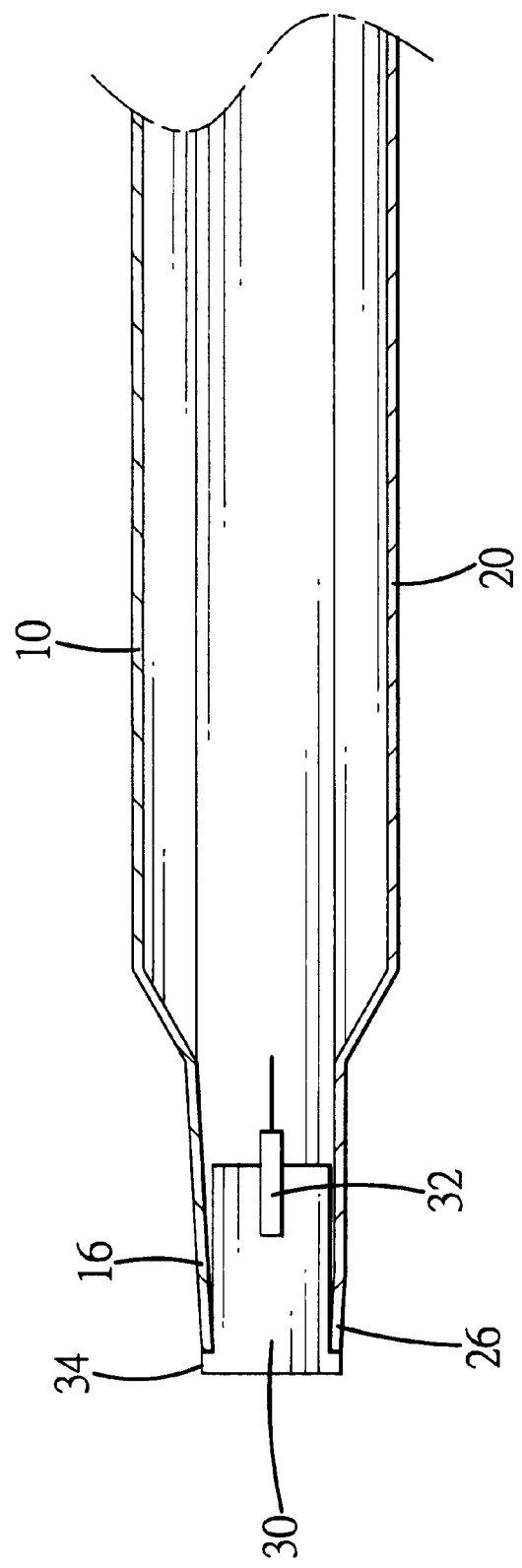
FIG. 7 is a schematic cross sectional view showing that the structure of the front sides of the upper casing and the lower casing.

With reference to FIG. 7 and taking reference of FIG. 2, the upper casing (10) further has a first inclined face (16) formed on a front side of the upper casing (10) and relative to a top face of the upper casing (10). The lower casing further has a second inclined face (26) formed on a front side of the lower casing (20) and relative to a bottom face of the lower casing (20). Therefore, when the assembly of the casing is finished, the first inclined face (16) of the upper casing (10) and the second inclined face (26) of the lower casing (20) abut a flange (34) formed on a front side of the connector (30) so as to position the connector (30) inside the casing.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A casing for a PC cartridge, the casing comprising:

an upper casing having clamping sides respectively formed on opposite sides of the upper casing, two hooks respectively and oppositely formed on a front side of the upper casing;

a lower casing securely connected to the upper casing and having a plastic frame with a tilting side formed on opposite sides of the frame, a pair of front positioning blocks oppositely formed on a front side of the frame, a holding portion formed on a rear of the lower casing, a holding edge formed on a front edge of the holding portion, the holding edge being inclined to a top face of the holding portion and a pair of rear positioning blocks oppositely formed on a rear side of the frame, wherein each of the front positioning blocks has an L shaped hole corresponding to the hooks of the upper casing, wherein each of the front positioning blocks has a cutout defined to face each other and being adapted to receive therein a protrusion formed on opposite sides of a connector sandwiched between the upper casing and the lower casing, wherein the upper casing further has a first inclined face formed on a front side of the upper casing and relative to a top face of the upper casing, the lower casing further has a second inclined face formed on a front side of the lower casing and relative to a bottom face of the lower casing, whereby the first inclined face of the upper casing and the second inclined face of the lower casing are adapted to abut a flange of the connector so as to position the connector inside the casing, and each clamping side clamping a bottom of a corresponding one of the tilting sides and the hooks being received in the L shaped holes to secure engagement between the upper casing and the lower casing.

* * * * *